(12) United States Patent
Choi

(10) Patent No.: US 8,017,931 B2
(45) Date of Patent: Sep. 13, 2011

(54) LED AND FABRICATION METHOD THEREOF

(75) Inventor: Sung Chul Choi, Iksan-si (KR)

(73) Assignee: LG Innotek Co., Ltd, Seoul (KR)

( * ) Notice: Subject to any disclaimer, the term of this patent is extended or adjusted under 35 U.S.C. 154(b) by 375 days.

(21) Appl. No.: 10/538,078

(22) PCT Filed: Dec. 8, 2003

(86) PCT No.: PCT/KR03/02683
§ 371 (c)(1),
(2), (4) Date: Jun. 9, 2005

(87) PCT Pub. No.: WO2004/054006
PCT Pub. Date: Jun. 24, 2004

(65) Prior Publication Data
US 2006/0163560 A1    Jul. 27, 2006

(30) Foreign Application Priority Data
Dec. 10, 2002  (KR) ................... 10-2002-0078067

(51) Int. Cl.
*H01L 29/06* (2006.01)
(52) U.S. Cl. ............. 257/13; 257/79; 257/E33.001; 438/40
(58) Field of Classification Search ............ 257/9, 15, 257/79, 13, E33.001; 438/40
See application file for complete search history.

(56) References Cited

U.S. PATENT DOCUMENTS
2001/0039066 A1* 11/2001 Hoon ...................... 438/21
2003/0010971 A1* 1/2003 Zhang et al. ............. 257/15

FOREIGN PATENT DOCUMENTS

| JP | 09-326506 A | | 12/1997 |
|---|---|---|---|
| JP | 10-256588 A | | 9/1998 |
| JP | 11354839 | * | 12/1999 |
| JP | 11354840 | * | 12/1999 |
| KR | 1998-66847 A | | 10/1998 |
| KR | 2000-18855 A | | 4/2000 |
| KR | 2001-87235 A | | 9/2001 |

OTHER PUBLICATIONS

Tanaka et al. "GaN Quantum structures with Fractional Dimension From Quantum Well o Quantum Dot," phys. stat sol. (b) 216 481, 1999.*
Tanaka et al, "Anti Surfactant in III-Nitride Epitaxy-Quantum Dot Formation and dislocation Termination," Japanese Journal of Appiled Physics, vol. 39 8b, 2000.*

* cited by examiner

*Primary Examiner* — Matthew Reames
(74) *Attorney, Agent, or Firm* — Birch, Stewart, Kolasch & Birch, LLP

(57) ABSTRACT

Disclosed is a quantum-dot LED and fabrication method thereof. The quantum-dot LED includes: a substrate; a n-type semiconductor layer formed on the substrate; an insulator layer formed on the n-type semiconductor layer and provided with a plurality of holes; quantum dots formed by filling the holes; and a p-type semiconductor layer formed on the insulator layer in which the quantum dots are formed. According to the inventive LED, the size and density of the quantum dots are controllable to thereby make the property control of the LED easy. Also, since it can be anticipated that the LED has a high internal quantum efficiency compared with the conventional LED using quantum well, high light emitting efficiency can be obtained.

11 Claims, 3 Drawing Sheets

(a)

(b)

LED AND FABRICATION METHOD THEREOF

TECHNICAL FIELD

The present invention an LED and fabrication method thereof, and more particularly to a quantum dots and fabrication method thereof in which quantum dots are artificially formed in a light emitting layer to maximize internal quantum efficiency, lower power consumption and enhance the reliability.

BACKGROUND ART

FIG. 1 illustrates a light emitting diode (hereinafter referred to as 'LED') in which quantum well layer is formed as the light emitting layer.

Referring to FIG. 1, the LED includes a substrate 1, and a n-type semiconductor layer 2, a quantum well layer 3 and a p-type semiconductor layer 4, which are laminated in the named order on the substrate 1.

In the LED of FIG. 1, when a forward bias is applied to the LED, electrons are supplied from the n-type semiconductor layer 2 and holes are supplied from the p-type semiconductor layer so that electrons and holes are recombined with each other in the quantum well layer 3. In the course of recombination, the LED emits light with an energy corresponding to excited level of quantum well or energy bandgap difference.

At this time, the quantum well layer 3 serves as the light emitting layer and accordingly shows a high internal quantum efficiency compared with an LED having a double heterojunction structure, but it is the reality that the internal quantum efficiency does not exceed 10%.

To this end, even when the LED is used as a high power LED, it has a drawback in that power consumption is high, a lot of heat is generated and the generated high temperature heat changes the characteristic of the LED to thereby lower the reliability.

DISCLOSURE OF THE INVENTION

Accordingly, the present invention has been made in an effort to solve the aforementioned problems of the conventional arts.

An object of the present invention is to provide an LED and fabrication method thereof in which quantum dots are formed inside a light emitting layer to thereby enhance the internal quantum efficiency.

To achieve these and other advantages and in accordance with the purpose of the present invention, as embodied and broadly described, a quantum-dot LED is characterized by comprising: a substrate; a n-type semiconductor layer formed on the substrate; an insulator layer formed on the n-type semiconductor layer and provided with a plurality of holes; quantum dots formed by filling the holes; and a p-type semiconductor layer formed on the insulator layer in which the quantum dots are formed.

In another aspect of the present invention, a quantum-dot LED is characterized by comprising: a substrate; a n-type semiconductor layer formed on the substrate; a first insulator layer formed on the n-type semiconductor layer and provided with a plurality of holes; quantum dots formed by filling the holes; a barrier layer formed on the first insulator layer in which the quantum dots are formed; a second insulator layer formed on the barrier layer and provided with holes and quantum dots like the first insulator layer; a p-type semiconductor layer formed on the second insulator layer.

Also, the first and second insulator layers formed interposing the barrier layer therebetween have a multi-layer structure.

In addition, the barrier layer is of one selected from the group consisting of GaN, GaAs and GaP.

Further, the holes are a nano-hole, and have a size range of 1 nanometer to 100 nanometers.

Alternatively, the quantum dots are formed from one selected from the group consisting of InGaN, InGaAs and InGaP.

Also, the quantum dots comprise an upper surface being in contact with the p-type semiconductor layer, and a lower surface being in contact with the n-type semiconductor layer.

In addition, the size and/or density of the holes are/is determined by deposition time of the insulator layer.

In another aspect of the present invention, a method for fabricating a quantum-dot LED, the method is characterized by comprising the steps of: forming a n-type semiconductor layer on a substrate; depositing a first insulator layer having first holes on the n-type semiconductor layer; filling the first holes of the first insulator layer to form first quantum dots; and depositing a p-type semiconductor layer on the first insulator layer in which the quantum dots are formed.

Also, the above method may further comprises the steps of: (a) after the step of forming the quantum dots, forming a barrier layer on the insulator layer in which the quantum dots are formed; (b) forming a second insulator layer having second holes on the barrier layer; and (c) filling the second hole of the second insulator layer to form second quantum dots, wherein the steps (a), (b) and (c) are repeated at least once.

In addition, in the step of depositing the insulator layer, the size and/or density are/is determined by deposition time of the insulator layer.

According to the above quantum-dot LED, internal quantum efficiency can be improved so that power consumption and heat radiation amount can be reduced to thereby enhance the external quantum efficiency and the reliability.

BEST MODE FOR CARRYING OUT THE INVENTION

Hereinafter, preferred embodiments of the present invention will be described in detail with reference to accompanying drawings.

Figure 1:
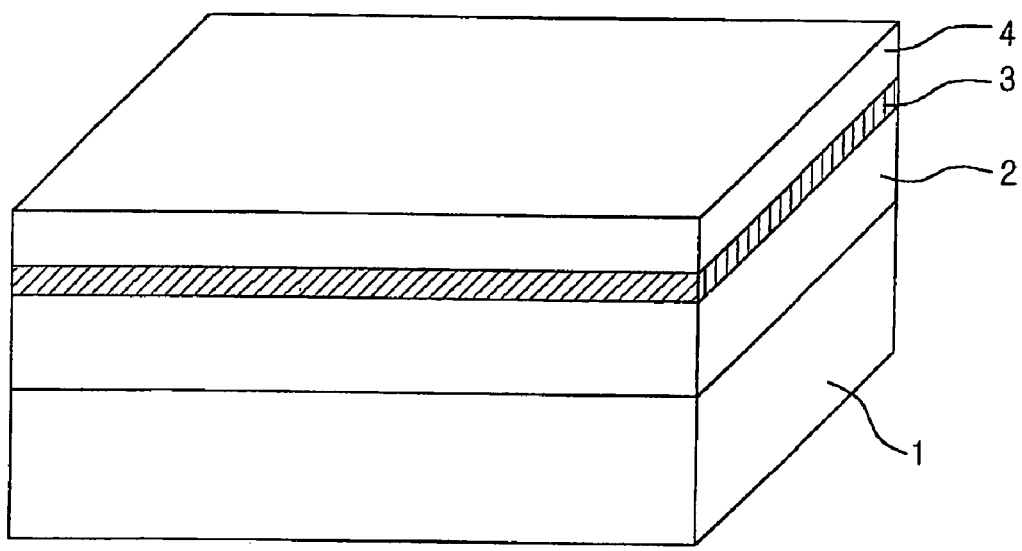
FIG. 1 illustrates an LED in which quantum well layer is formed as the light emitting layer.
Figure 2:
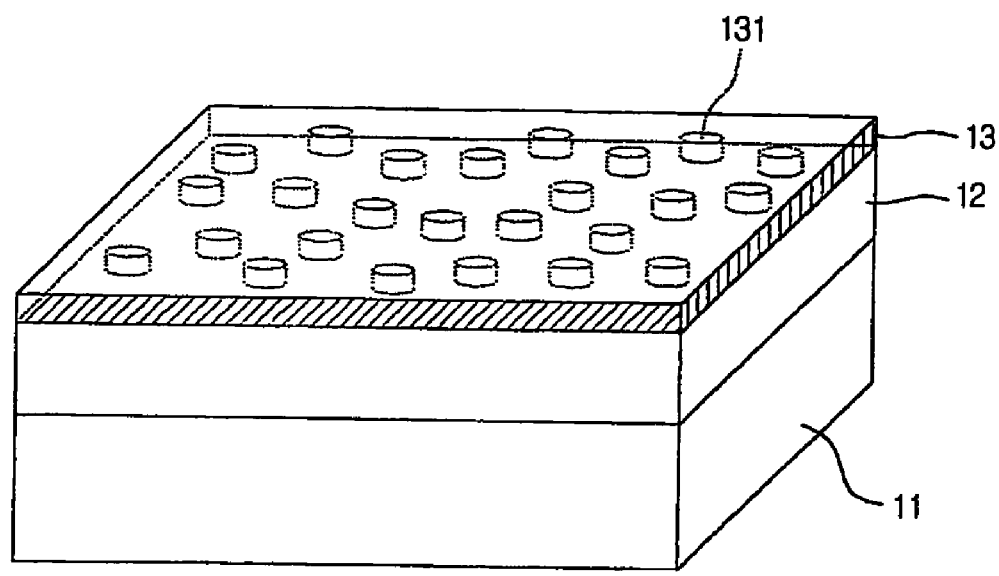
FIGS. 2(a) and (b) are perspective views illustrating a fabrication method of a quantum-dot LED according to the present invention.
Figure 2:
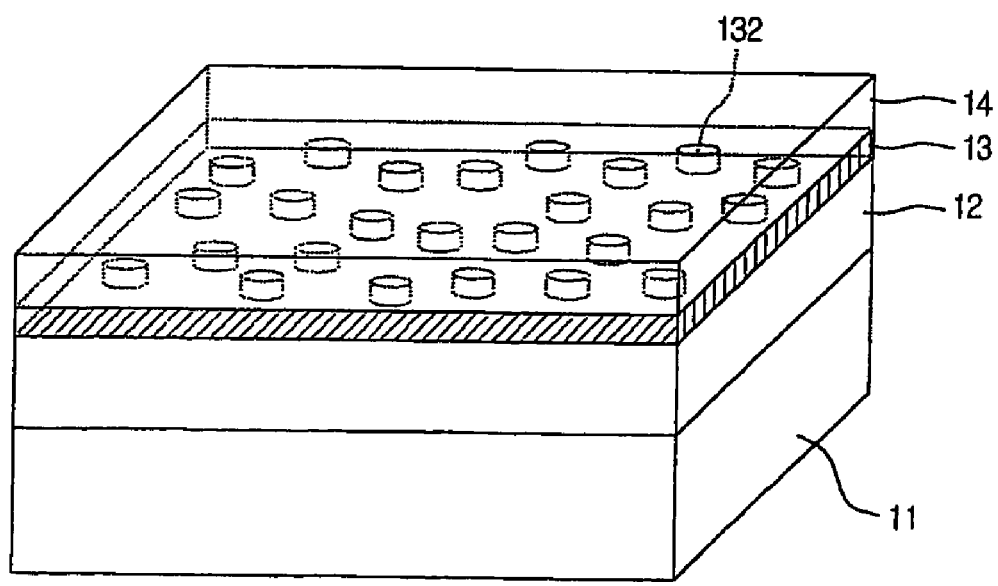

FIGS. 2(a) and (b) are perspective views illustrating a fabrication method of a quantum-dot LED according to the present invention.

First, referring to FIG. 2(a), a quantum-dot LED includes a substrate 11, a n-type semiconductor layer 12 formed on the substrate and doped with silicon or the like; and an insulator layer 13 formed on the n-type semiconductor layer 12. In particular, inside the insulator layer 13, there are formed a plurality of nano-holes.

For instance, the substrate 11 may be sapphire substrate, and the n-type semiconductor layer 12 may be of one selected from the group consisting of GaN, GaAs and GaP. Also, the insulator layer 13 may be of SiNx or $SiO_2$.

Next, a flow for the formation of nano-holes will be described in detail.

The insulator layer 13 is grown on the n-type semiconductor layer 12 by various methods such as MOCVD (Metal Organic Chemical Vapor Deposition). In an initial growth stage, the insulator layer 13 is deposited while forming grains. As the deposition advances, the grains of the insulator layer 13 are combined so that their sizes are increased. On the surface of the n-type semiconductor layer where the combination of the grains is not performed, nano-holes 131 are formed without the insulator layer 13.

The sizes of the nano-holes 131 are reduced as the growth of the insulator layer 13 advances. To this end, a desired size of the nano-hole 131 can be formed by controlling the growth time of the insulator layer 13. Preferably, the nano-hole 131 has a size range of 1-100 nm.

Referring to FIG. 2(b), after the nano-holes 131 have been grown to a proper size, material forming active layer is filled in the nano-holes 131 to thereby form quantum dots 132. The material for forming the quantum dots 132 may be one selected from the group consisting of InGaN, InGaAs and InGaP.

Then, a p-type semiconductor layer 14 doped with magnesium (Mg) or Zinc (Zn) is formed on the insulator layer 13 where the quantum dots 132 are formed.

Further, electrodes (not shown) are formed on the n-type semiconductor layer 12 and the p-type semiconductor layer 14, and a bias is applied to the electrodes.

Finally, the quantum-dot LED according to the present invention as shown in FIG. 2(b), is configured to include the substrate 11, the n-type semiconductor layer 12 formed on the substrate 11, the insulator layer 13 formed on the n-type semiconductor layer 12 and in which the plurality of quantum dots 132 are included, and the p-type semiconductor layer 14 formed on the insulator layer 13.

By the above construction, the upper surfaces of the quantum dots 132 are in contact with the p-type semiconductor layer 14, and the lower surfaces of the quantum dots 132 are in contact with the n-type semiconductor layer 12. Hence, in case a forward bias is applied to the inventive LED, electrons supplied from the n-type semiconductor layer 12 are recombined with holes supplied from the p-type semiconductor 14 so that light is emitted from quantum dots.

Since the quantum dots 132 are formed as above, it is possible to control the size and density of the quantum dots 132 so that the characteristics of the LED can be controlled with ease. Also, the inventive LED has a high internal quantum efficiency compared with the conventional LED using quantum well layer so that light emitting efficiency can be further enhanced.

Figure 3:
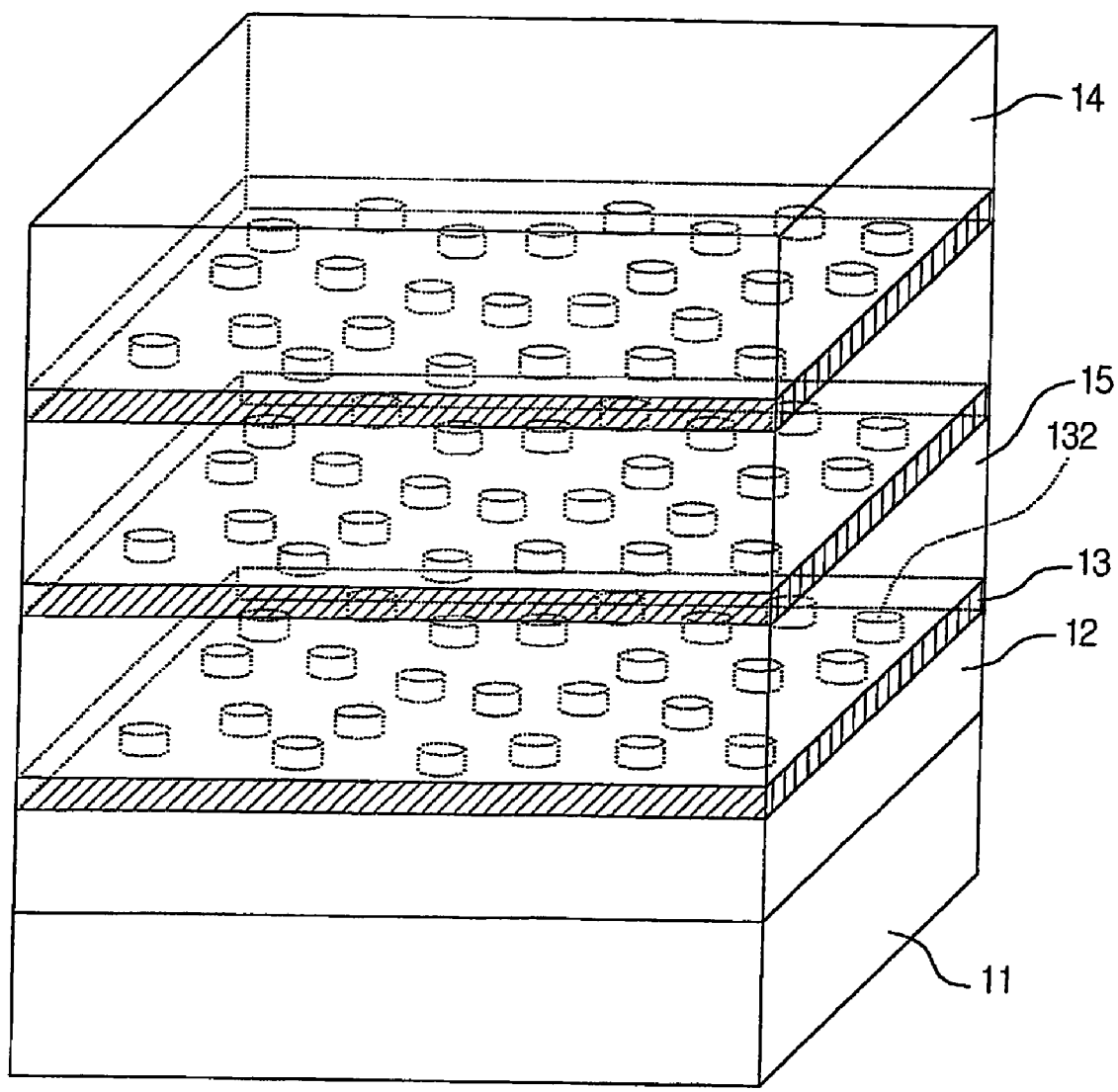
FIG. 3 illustrates another embodiment of the present invention.

FIG. 3 illustrates another embodiment of the present invention.

Referring to FIG. 3, the LED of the present embodiment has the same in the process for forming the nano-holes (see 131 of FIG. 2) and the quantum dots (see 132 of FIG. 2) as that of the previous embodiment.

The fabrication method of the LED of the present embodiment is different with that of the LED of the previous embodiment in that after forming the insulator layer 13 in which the plurality of quantum dots 132 are formed, it further includes the steps of: forming a barrier layer 15 on the insulator layer 13; and forming another insulator layer on the barrier layer 15. As a result, the insulators are formed interposing the barrier layer 15 therebetween in a multi-layer structure.

The barrier layer 15 is of one selected from the group consisting of GaN, GaAs and GaP. Since the barrier layer 15 is first grown on the upper surfaces of the quantum dots 132 and then grown in a horizontal direction, the barrier of the quantum dots 132 is made with the reliability.

The uppermost layer shown in FIG. 3 indicates the p-type semiconductor layer 14. In this embodiment, three insulator layers 13 each of which includes a plurality of quantum dots 132 are included.

Thus, two or more insulator layers 13 each including the plurality of quantum dots are formed so that light emitting efficiency can be further enhanced.

The spirit of the present invention is characterized in the construction of the quantum-dot LED in which quantum dots are formed, and the fabrication method of the LED.

INDUSTRIAL APPLICABILITY

As described above, according to the inventive quantum-dot LED, the size and density of the quantum dots are controllable so that it is easy to control the characteristics of the LED.

Also, high quantum efficiency can be anticipated compared with the conventional LED using the quantum well so that high light emitting efficiency is obtained.

Further, high internal quantum efficiency causes the power consumption to be lowered so that the reliability of the LED is improved.

While the present invention has been described and illustrated herein with reference to the preferred embodiments thereof, it will be apparent to those skilled in the art that various modifications and variations can be made therein without departing from the spirit and scope of the invention. Thus, it is intended that the present invention covers the modifications and variations of this invention that come within the scope of the appended claims and their equivalents.

The invention claimed is:

1. A quantum-dot LED comprising:
   an n-type semiconductor layer;
   at least one insulator layer formed on the n-type semiconductor layer and provided with a plurality of holes;
   quantum dots formed by filling the holes; and
   a p-type semiconductor layer formed on the insulator layer in which the quantum dots are formed,
   wherein the p-type semiconductor layer is contacted with the quantum dots, or both the n-type semiconductor layer and the p-type semiconductor layer are contacted with the quantum dots, and
   wherein the insulator layer comprises a first insulator layer formed on the n-type semiconductor layer and a second insulator layer formed on the first insulator layer, and the quantum-dot LED comprises a barrier layer inserted between the first insulator layer and the second insulator layer.

2. The quantum-dot LED according to claim 1, wherein the first and second insulator layers formed interposing the barrier layer therebetween has a multi-layer structure.

3. The quantum-dot LED according to claim 1, wherein the barrier layer is of one selected from the group consisting of GaN, GaAs and GaP.

4. The quantum-dot LED according to claim 1, wherein the holes are nano-holes.

5. The quantum-dot LED according to claim 1, wherein the holes have a size range of 1 nanometer to 100 nanometers.

6. The quantum-dot LED according to claim 1, wherein the quantum dots are formed from one selected from the group consisting of InGaN, InGaAs and InGaP.

7. The quantum-dot LED according to claim 1, wherein the quantum dots comprise an upper surface being in direct contact with the p-type semiconductor layer, and a lower surface being in direct contact with the n-type semiconductor layer.

8. The quantum-dot LED according to claim 1, wherein the size and/or density of the holes are/is determined by deposition time of the insulator layer.

9. A method for fabricating a quantum-dot LED, the method comprising the steps of:

forming an n-type semiconductor layer;

depositing a first insulator layer having first holes on the n-type semiconductor layer;

filling the first holes of the first insulator layer to form first quantum dots, wherein (a) after the step of forming the quantum dots, forming a barrier layer on the insulator layer in which the quantum dots are formed; (b) forming a second insulator layer having second holes on the barrier layer; and (c) filling the second hole of the second insulator layer to form second quantum dots, wherein the steps (a), (b) and (c) are repeated at least once; and depositing a p-type semiconductor layer on the first insulator layer in which the quantum dots are formed, wherein the p-type semiconductor layer is contacted with the quantum dots, or both the n-type semiconductor layer and the p-type semiconductor layer are contacted with the quantum dots.

10. The method according to claim 9, wherein in the step of depositing the insulator layers, the size and/or density are/is determined by deposition time of the insulator layer.

11. The method according to claim 9, wherein the first quantum dots comprise an upper surface being in direct contact with the p-type semiconductor layer, and a lower surface being in direct contact with the n-type semiconductor layer.

* * * * *